(12) United States Patent
Yumoto et al.

(10) Patent No.: US 10,141,439 B2
(45) Date of Patent: Nov. 27, 2018

(54) SEMICONDUCTOR DEVICE AND METHOD OF MANUFACTURING THE SAME

(71) Applicant: KABUSHIKI KAISHA TOSHIBA, Minato-ku (JP)

(72) Inventors: Miki Yumoto, Kawasaki (JP); Masahiko Kuraguchi, Yokohama (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 29 days.

(21) Appl. No.: 15/424,422

(22) Filed: Feb. 3, 2017

(65) Prior Publication Data
US 2017/0148908 A1    May 25, 2017

Related U.S. Application Data

(62) Division of application No. 14/452,877, filed on Aug. 6, 2014, now abandoned.

(30) Foreign Application Priority Data

Sep. 20, 2013 (JP) .................................. 2013-196132

(51) Int. Cl.
*H01L 29/78* (2006.01)
*H01L 21/8252* (2006.01)
(Continued)

(52) U.S. Cl.
CPC ...... *H01L 29/7806* (2013.01); *H01L 21/0254* (2013.01); *H01L 21/8252* (2013.01);
(Continued)

(58) Field of Classification Search
CPC ............... H01L 29/7806; H01L 29/782; H01L 29/66143; H01L 29/66212
See application file for complete search history.

(56) References Cited

U.S. PATENT DOCUMENTS 5,789,311 A  8/1998 Ueno et al.
8,093,626 B2  1/2012 Niiyama
(Continued)

FOREIGN PATENT DOCUMENTS

CN  103201844 A  7/2013
JP  8-97441 A  4/1996
(Continued)

OTHER PUBLICATIONS

Extended European Search Report dated Jan. 20, 2015 in Patent Application No. 14176971.1.

*Primary Examiner* — Daniel Whalen
*Assistant Examiner* — Suberr Chi
(74) *Attorney, Agent, or Firm* — Oblon, McClelland, Maier & Neustadt, L.L.P.

(57) ABSTRACT

A semiconductor device according to an embodiment includes a first GaN based semiconductor layer of a first conductive type, a second GaN based semiconductor layer of the first conductive type provided above the first GaN based semiconductor layer, a third GaN based semiconductor layer of a second conductive type provided above a part of the second GaN based semiconductor layer, a epitaxially grown fourth GaN based semiconductor layer of the first conductive type provided above the third GaN based semiconductor layer, a gate insulating film provided on the second, third, and fourth GaN based semiconductor layer, a gate electrode provided on the gate insulating film, a first electrode provided on the fourth GaN based semiconductor layer, a second electrode provided at the side of the first GaN based semiconductor layer opposite to the second GaN based semiconductor layer, and a third electrode provided on the second GaN based semiconductor layer.

9 Claims, 13 Drawing Sheets

(51) Int. Cl.
  *H01L 27/06* (2006.01)
  *H01L 21/02* (2006.01)
  *H01L 29/20* (2006.01)
  *H01L 29/66* (2006.01)
  *H01L 29/872* (2006.01)
  *H01L 29/10* (2006.01)

(52) U.S. Cl.
  CPC ...... *H01L 27/0605* (2013.01); *H01L 27/0629* (2013.01); *H01L 29/1095* (2013.01); *H01L 29/2003* (2013.01); *H01L 29/66143* (2013.01); *H01L 29/66522* (2013.01); *H01L 29/66734* (2013.01); *H01L 29/7813* (2013.01); *H01L 29/872* (2013.01)

(56) References Cited

U.S. PATENT DOCUMENTS

| | | |
|---|---|---|
| 2002/0047124 A1* | 4/2002 | Kitabatake .......... H01L 27/0629 257/73 |
| 2003/0162355 A1 | 8/2003 | Sankin et al. |
| 2006/0011924 A1* | 1/2006 | Mazzola ............. H01L 27/0641 257/77 |
| 2006/0220060 A1 | 10/2006 | Nakata et al. |
| 2009/0283776 A1 | 11/2009 | Iwamuro |
| 2010/0283083 A1 | 11/2010 | Niiyama et al. |
| 2011/0204381 A1 | 8/2011 | Okada et al. |
| 2011/0309464 A1 | 12/2011 | Yamamoto et al. |
| 2012/0273797 A1 | 11/2012 | Okada et al. |
| 2013/0112985 A1 | 5/2013 | Kizilyalli et al. |
| 2013/0119394 A1 | 5/2013 | Zhu et al. |
| 2013/0143392 A1 | 6/2013 | Romano et al. |
| 2013/0248876 A1 | 9/2013 | Yaegashi et al. |
| 2013/0313564 A1 | 11/2013 | Okada et al. |
| 2013/0313635 A1 | 11/2013 | Nakano |
| 2014/0159051 A1 | 6/2014 | Kizilyalli et al. |

FOREIGN PATENT DOCUMENTS

| | | |
|---|---|---|
| JP | 2003-68760 A | 3/2003 |
| JP | 2005-518672 A | 6/2005 |
| JP | 2007-266475 | 10/2007 |
| JP | 2008-22029 | 1/2008 |
| JP | 2008-177369 A | 7/2008 |
| JP | 2009-117820 A | 5/2009 |
| JP | 2009-278067 | 11/2009 |
| JP | 2010-40698 A | 2/2010 |
| JP | 2010-62381 | 3/2010 |
| JP | 2011-129775 | 6/2011 |
| JP | 2012-9502 A | 1/2012 |
| WO | WO 2011/013500 A1 | 2/2011 |
| WO | WO 2012/105609 A1 | 8/2012 |
| WO | WO 2013/066967 A1 | 5/2013 |

* cited by examiner

SEMICONDUCTOR DEVICE AND METHOD OF MANUFACTURING THE SAME

CROSS-REFERENCE TO RELATED APPLICATION

This application is a Divisional of U.S. application Ser. No. 14/452,877 filed Aug. 6, 2014, and is based upon and claims the benefit of priority from Japanese Patent Application No. 2013-196132, filed on Sep. 20, 2013, the entire contents of each of which are incorporated herein by reference.

FIELD

Embodiments described herein relate generally to a semiconductor device and a method of manufacturing the same

BACKGROUND

An application of a GaN based semiconductor having high dielectric breakdown strength to a semiconductor device for power electronics or a high frequency power semiconductor device has been expected. In order to realize scaling-down of a system using the GaN based semiconductor and low power consumption, it has been requested to form a plurality of GaN based semiconductor elements, for example, transistors and diodes in one chip.

Meanwhile, in the GaN based semiconductor, it is difficult to increase an activation rate of impurities introduced by ion implantation. For this reason, it is difficult to form in one chip the transistors and the diodes each requiring different structure of impurity layers.

DETAILED DESCRIPTION

Figure 1:
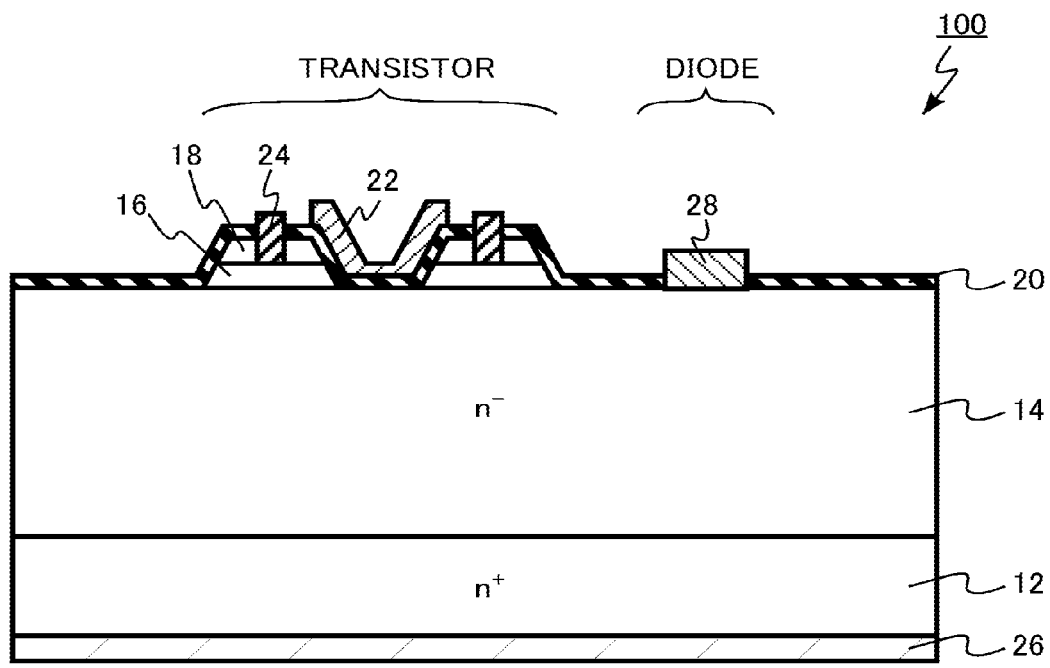
FIG. 1 is a schematic cross-sectional view illustrating a configuration of a semiconductor device according to a first embodiment.

A semiconductor device according to embodiments includes a first GaN based semiconductor layer of a first conductive type; a second GaN based semiconductor layer of the first conductive type provided above the first GaN based semiconductor layer, the second GaN based semiconductor layer having an impurity concentration of the first conductive type lower than that of the first GaN based semiconductor layer; a third GaN based semiconductor layer of a second conductive type provided above a part of the second GaN based semiconductor layer; a fourth GaN based semiconductor layer of the first conductive type provided above the third GaN based semiconductor layer, the fourth GaN based semiconductor layer being an epitaxial growth layer, the fourth GaN based semiconductor layer having the impurity concentration of the first conductive type higher than that of the second GaN based semiconductor layer; a gate insulating film provided on the second GaN based semiconductor layer, the third GaN based semiconductor layer, and the fourth GaN based semiconductor layer; a gate electrode provided on the gate insulating film; a first electrode provided on the fourth GaN based semiconductor layer; a second electrode provided at the side of the first GaN based semiconductor layer opposite to the second GaN based semiconductor layer; and a third electrode provided on the second GaN based semiconductor layer.

In the present specification, the "GaN based semiconductor" collectively means a semiconductor that contains gallium nitride (GaN), aluminum nitride (AlN), indium nitride (InN), and intermediate compositions thereof. In addition, in the present specification, AlGaN means a semiconductor that is expressed by a compositional formula of $Al_xGa_{1-x}N$ (0<x<1).

In the following description, the notation of $n^+$, n, $n^-$ and $p^+$, p, and $p^-$ illustrates the relative difference of the impurity concentration in each conductive type. That is, an n-type impurity concentration of $n^+$ is relatively higher than that of n and the n-type impurity concentration of $n^-$ is relatively lower than that of n. In addition, a p-type impurity concentration of $p^+$ is relatively higher than that of p and the p-type impurity concentration of $p^-$ is relatively lower than that of p. In addition, an $n^+$ type and an $n^-$-type may be simply referred to as an n type and a $p^+$ type and a $p^-$-type may be simply referred to as a p type.

First Embodiment

A semiconductor device according to this embodiment includes a first GaN based semiconductor layer of a first conductive type, a second GaN based semiconductor layer of the first conductive type that is provided on or above the first GaN based semiconductor layer and has an impurity concentration of the first conductive type lower than that of the first GaN based semiconductor layer, a third GaN based semiconductor layer of a second conductive type that is provided in a partial region on or above the second GaN based semiconductor layer, a fourth GaN based semiconductor layer of the first conductive type that is provided on or above the third GaN based semiconductor layer, is an epitaxial growth layer, and has the impurity concentration of the first conductive type higher than that of the second GaN based semiconductor layer, a gate insulating film that is provided on the second GaN based semiconductor layer, the third GaN based semiconductor layer, and the fourth GaN based semiconductor layer, a gate electrode that is provided on the gate insulating film, a first electrode that is provided on the fourth GaN based semiconductor layer, a second electrode that is provided at the side of the first GaN based semiconductor layer opposite to the second GaN based semiconductor layer, and a third electrode that is provided on the second GaN based semiconductor layer.

Figure 2:
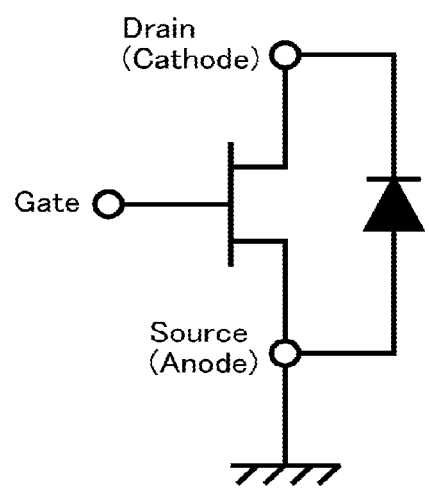
FIG. 2 is a circuit diagram of the semiconductor device according to the first embodiment.

FIG. 1 is a schematic cross-sectional view illustrating a configuration of the semiconductor device according to this embodiment. FIG. 2 is a circuit diagram of the semiconductor device according to this embodiment.

In a semiconductor device 100, a transistor and a diode are formed in one chip. As illustrated in FIG. 2, a source electrode of the transistor and an anode electrode of the diode are made to be common and a drain electrode of the transistor and a cathode electrode of the diode are made to be common. The diode is useful for preventing an overcurrent to flow to the transistor.

The transistor is a metal-insulator-semiconductor-field effect transistor (MISFET). In addition, the diode is a Schottky barrier diode (SBD).

In this embodiment, an example of the case in which the first conductive type is an n type and the second conductive type is a p type will be described. Therefore, the transistor is an n channel type transistor that uses electrons as carriers. In addition, the transistor is a vertical transistor that moves carriers between a source electrode of a surface side of a semiconductor substrate and a drain electrode of a back surface side.

The semiconductor device 100 includes an $n^-$-type GaN layer (second GaN based semiconductor layer) 14 provided on an $n^+$-type GaN layer (first GaN based semiconductor layer) 12.

The $n^+$-type GaN layer 12 functions as a drain region of the transistor and a cathode region of the diode. For example, the $n^+$-type GaN layer 12 contains Si (silicon) as n-type impurities.

An n-type impurity concentration of the $n^+$-type GaN layer 12 is, for example, $1 \times 10^{18}$ $cm^{-1}$ to $1 \times 10^{20}$ $cm^{-1}$.

The $n^-$-type GaN layer 14 is a so-called drift layer. For example, the $n^-$-type GaN layer 14 contains Si (silicon) as n-type impurities. An n-type impurity concentration of the $n^-$-type GaN layer 14 is, for example, $1 \times 10^{14}$ $cm^{-3}$ to $1 \times 10^{18}$ $cm^{-3}$. The n-type impurity concentration of the $n^-$-type GaN layer 14 is lower than the n-type impurity concentration of the $n^+$-type GaN layer 12. The thickness of the $n^-$-type GaN layer 14 is, for example, 1 μm to 20 μm.

The semiconductor device includes a p-type GaN layer (third GaN based semiconductor layer) 16 provided in a partial region on the $n^-$-type GaN layer (second GaN based semiconductor layer) 14. For example, the p-type GaN layer 16 contains Mg (magnesium) as p-type impurities. The p-type GaN layer 16 is an epitaxial growth layer. The p-type GaN layer 16 functions as a channel region (base region) of the transistor.

An $n^+$-type GaN layer (fourth GaN based semiconductor layer) 18 is provided on the p-type GaN layer (third GaN based semiconductor layer) 16. The $n^+$-type GaN layer 18 functions as a source region of the transistor.

The $n^+$-type GaN layer 18 is an epitaxial growth layer. The n-type impurity concentration of the $n^+$-type GaN layer 18 is higher than that of the $n^-$-type GaN layer 14.

For example, the $n^+$-type GaN layer 18 contains Si (silicon) as the n-type impurities. The n-type impurity concentration of the $n^+$-type GaN layer 18 is, for example, $1 \times 10^{18}$ $cm^{-3}$ to $1 \times 10^{23}$ $cm^{-3}$.

The p-type GaN layer 16 and the $n^+$-type GaN layer 18 have a mesa structure. That is, the p-type GaN layer 16 and the $n^+$-type GaN layer 18 protrude on the $n^-$-type GaN layer 14 and have a cross-section of a trapezoidal shape. A side of the mesa structure does not necessarily have a tapered shape and may be a vertical surface.

A gate insulating film 20 is provided continuously on the $n^-$-type GaN layer (second GaN based semiconductor layer) 14, the p-type GaN layer (third GaN based semiconductor layer) 16, and the $n^+$-type GaN layer (fourth GaN based semiconductor layer) 18. The gate insulating film 20 is, for example, a silicon oxide film or a silicon nitride film.

A gate electrode 22 is formed on the gate insulating film 20. The gate electrode 22 is provided in a region between two mesa structures. For example, the gate electrode 22 is a metal such as Ni (nickel) and Ti (titan). In addition to the metal, metal silicide and polysilicon or the like can be applied to the gate electrode 22.

An interlayer insulating film (not illustrated) formed of a silicon oxide film or a silicon nitride film is formed on the gate electrode 22.

In addition, a source electrode (first electrode) 24 is provided in the $n^+$-type GaN layer (fourth GaN based semiconductor layer) 18. For example, the source electrode 24 is a metal containing Ni (nickel).

In this embodiment, the source electrode (first electrode) 24 is provided in a groove in which one end is positioned at the n+-type GaN layer (fourth GaN based semiconductor layer) 18 and the other end is positioned at the p-type GaN layer (third GaN based semiconductor layer) 16. In addition, the source electrode 24 contacts the p-type GaN layer 16.

By this configuration, the source electrode 24 also functions as an electrode to apply a potential to a channel region (base region). In other words, the source electrode 24 and a channel electrode (base electrode) are made to be common and two contacts are realized easily with a small area.

However, the source electrode 24 and the channel electrode (base electrode) may be individually provided. In this case, the groove may not be provided and the source electrode 24 may be connected at a surface of the n+-type GaN layer (fourth GaN based semiconductor layer) 18.

The n+-type GaN layer (fourth GaN based semiconductor layer) 18 and the source electrode (first electrode) 24 are preferably ohmic-connected to each other, from the viewpoint of increasing an on-state current of the transistor.

In addition, a drain electrode (second electrode) 26 is provided at the side of the n+-type GaN layer (first GaN based semiconductor layer) 12 opposite to the n−-type GaN layer (second GaN based semiconductor layer) 14. The drain electrode 26 also functions as a cathode electrode of the diode. For example, the drain electrode 26 is a metal containing Ni.

The n+-type GaN layer (first GaN based semiconductor layer) 12 and the drain electrode (second electrode) 26 are preferably ohmic-connected to each other, from the viewpoint of increasing an on-state current of the transistor and increasing a forward current of the diode.

An anode electrode (third electrode) 28 is provided on the n−-type GaN layer (second GaN based semiconductor layer) 14. The n−-type GaN layer (second GaN based semiconductor layer) 14 and the anode electrode (third electrode) 28 are Schottky-connected to each other. For example, the anode electrode 28 includes a laminated structure of Ni (nickel)/Au (gold).

The source electrode (first electrode) 24 and the anode electrode (third electrode) 28 are preferably formed of different materials, from the viewpoint of optimizing individual contact characteristics.

The source electrode 24 and the anode electrode 28 may be configured to be made to be common by a wiring line not illustrated and apply the same potential or may be configured to be made not to be common and apply differential potentials.

Next, a first manufacturing method of the semiconductor device according to this embodiment will be described.

The first manufacturing method of the semiconductor device according to this embodiment includes forming a second GaN based semiconductor layer of a first conductive type having an impurity concentration of the first conductive type lower than that of a first GaN based semiconductor layer on the first GaN based semiconductor layer by an epitaxial growth method, forming a third GaN based semiconductor layer of a second conductive type on the second GaN based semiconductor layer by the epitaxial growth method, forming a fourth GaN based semiconductor layer of the first conductive type having the impurity concentration of the first conductive type higher than that of the second GaN based semiconductor layer on the third GaN based semiconductor layer by the epitaxial growth method, etching partial regions of the fourth GaN based semiconductor layer and the third GaN based semiconductor layer to expose a partial region of the second GaN based semiconductor layer and forming a plurality of first convex portions of a stacked structure of the third GaN based semiconductor layer and the fourth GaN based semiconductor layer, forming a gate insulating film on the second GaN based semiconductor layer, the third GaN based semiconductor layer, and the fourth GaN based semiconductor layer, forming a gate electrode on the gate insulating film, forming a first electrode on the fourth GaN based semiconductor layer, forming a second electrode at the side of the first GaN based semiconductor layer opposite to the second GaN based semiconductor layer, and forming a third electrode on the second GaN based semiconductor layer.

FIGS. 3 to 7 are schematic cross-sectional views illustrating the first manufacturing method of the semiconductor device according to this embodiment.

First, the n+-type GaN layer (first GaN based semiconductor layer) 12 that contains as the n-type impurities Si (silicon) with the impurity concentration of $1 \times 10^{18}$ cm$^{-3}$ to $1 \times 10^{20}$ cm$^{-3}$ is prepared. The n+-type GaN layer 12 becomes a substrate of the epitaxial growth.

Next, the high-resistance n−-type GaN layer (second GaN based semiconductor layer) 14 that contains as the n-type impurities Si with the impurity concentration of $5 \times 10^{15}$ cm$^{-1}$ to $5 \times 10^{17}$ cm$^{-1}$ and has a film thickness of 0.5 μm to 30 μm is formed on the n+-type GaN layer 12 by the epitaxial growth method. For example, the epitaxial growth is performed by a metal organic chemical vapor deposition (MOCVD) method.

Next, the p-type GaN layer (third GaN based semiconductor layer) 16 containing the p-type impurities is formed on the n−-type GaN layer (second GaN based semiconductor layer) 14 by the epitaxial growth method. The p-type impurities are, for example, Mg (magnesium). In addition, source gas is, for example, trimethyl gallium (TMG) or ammonia (NH$_3$) and a p-type dopant in the source gas is, for example, is cyclopentadienyl magnesium (Cp$_2$Mg).

Next, the n+-type GaN layer (fourth GaN based semiconductor layer) 18 is formed on the p-type GaN layer (third GaN based semiconductor layer) 16 by the epitaxial growth method. The n+-type GaN layer 18 contains as the n-type impurities Si (silicon) with the impurity concentration of $1 \times 10^{18}$ cm$^{-3}$ to $1 \times 10^{20}$ cm$^{-3}$.

Figure 3:
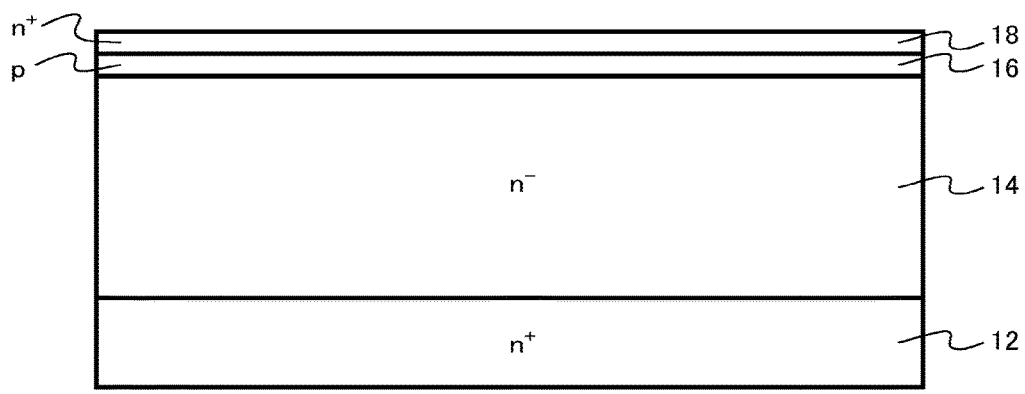
FIG. 3 is a schematic cross-sectional view illustrating a first manufacturing method of the semiconductor device according to the first embodiment.

In this way, a stacked structure of the n+-type GaN layer (first GaN based semiconductor layer) 12, the n−-type GaN layer (second GaN based semiconductor layer) 14, the p-type GaN layer (third GaN based semiconductor layer) 16, and the n+-type GaN layer (fourth GaN based semiconductor layer) 18 is formed (refer to FIG. 3).

Next, the partial regions of the n+-type GaN layer (fourth GaN based semiconductor layer) 18 and the p-type GaN layer (third GaN based semiconductor layer) 16 are etched to expose the n−-type GaN layer (second GaN based semiconductor layer) and the first convex portion of the stacked structure of the p-type GaN layer (third GaN based semiconductor layer) 16 and the n+-type GaN layer (fourth GaN based semiconductor layer) 18 is formed.

Figure 4:
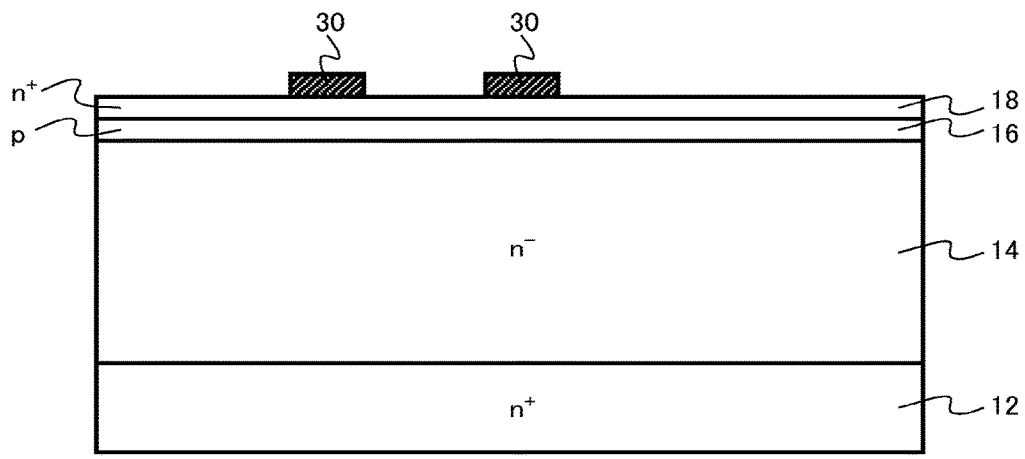
FIG. 4 is a schematic cross-sectional view illustrating the first manufacturing method of the semiconductor device according to the first embodiment.

Specifically, a mask material 30 is formed on the n+-type GaN layer (fourth GaN based semiconductor layer) 18 using a lithographic technique (refer to FIG. 4). The mask material 30 is a resist.

Figure 5:
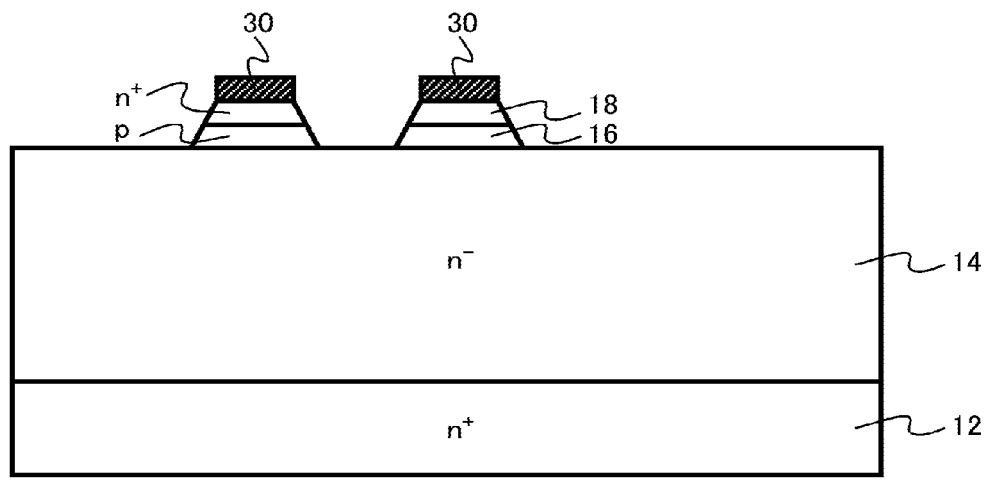
FIG. 5 is a schematic cross-sectional view illustrating the first manufacturing method of the semiconductor device according to the first embodiment.

Next, the n+-type GaN layer (fourth GaN based semiconductor layer) 18 and the p-type GaN layer (third GaN based semiconductor layer) 16 are etched using the mask material 30 as a mask and a mesa structure (first convex portion) is formed (refer to FIG. 5). For example, the etching is performed by reactive ion etching (RIE).

Figure 6:
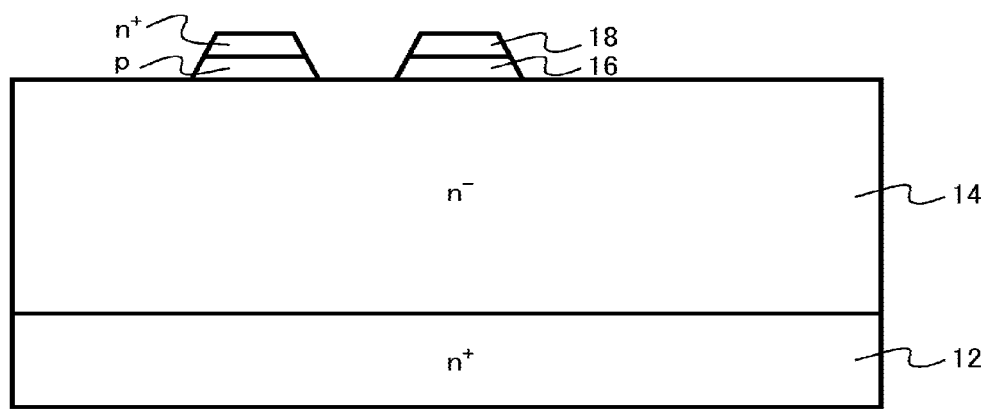
FIG. 6 is a schematic cross-sectional view illustrating the first manufacturing method of the semiconductor device according to the first embodiment.

Next, the mask material 30 is peeled (refer to FIG. 6).

Figure 7:
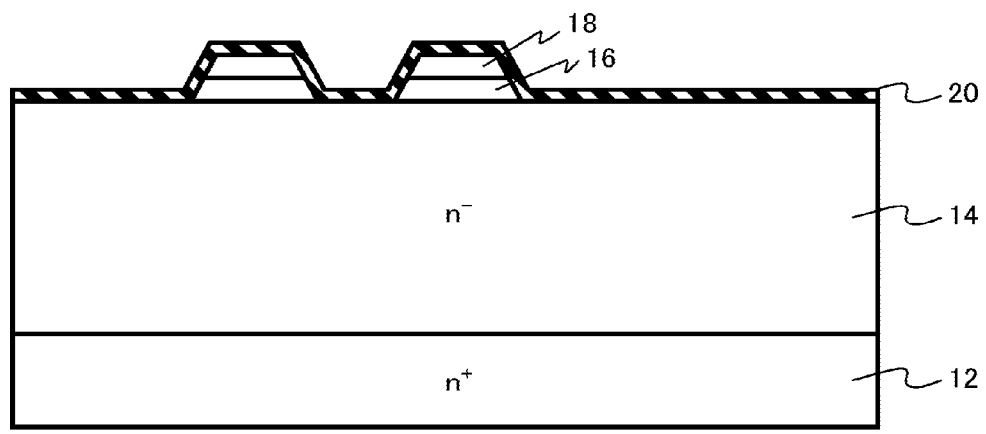
FIG. 7 is a schematic cross-sectional view illustrating the first manufacturing method of the semiconductor device according to the first embodiment.

The gate insulating film 20 is formed on the n⁻-type GaN layer (second GaN based semiconductor layer) 14, the p-type GaN layer (third GaN based semiconductor layer) 16, and the n⁺-type GaN layer (fourth GaN based semiconductor layer) 18 between the two mesa structures (first convex portions) (refer to FIG. 7). For example, the gate insulating film 20 is formed by depositing a silicon nitride film by a low pressure chemical vapor deposition (LPCVD) method and a plasma enhanced chemical vapor deposition (PECVD) method.

Next, the gate electrode 22 is formed on the gate insulating film 20. In the formation of the gate electrode 22, a resist mask is formed on the gate insulating film 20 using a photolithographic technique. Then, the gate electrode 22 is formed in only a patterned place using a deposition method and a lift-off method.

Then, the source electrode (first electrode) 24, the drain electrode (second electrode) 26, and the anode electrode (third electrode) 28 are formed using a known process.

By the manufacturing method described above, the semiconductor device according to this embodiment illustrated in FIG. 1 is manufactured.

Next, a second manufacturing method of the semiconductor device according to this embodiment will be described.

A second manufacturing method of the semiconductor device according to this embodiment includes forming a second GaN based semiconductor layer of a first conductive type having an impurity concentration of the first conductive type lower than that of a first GaN based semiconductor layer on the first GaN based semiconductor layer by an epitaxial growth method, covering a partial region on the second GaN based semiconductor layer by a first mask material and forming a third GaN based semiconductor layer of a second conductive type by a selective epitaxial growth method, forming a fourth GaN based semiconductor layer of the first conductive type having the impurity concentration of the first conductive type higher than that of the second GaN based semiconductor layer in at least a partial region on the third GaN based semiconductor layer by the selective epitaxial growth method, forming a gate insulating film on the second GaN based semiconductor layer, the third GaN based semiconductor layer, and the fourth GaN based semiconductor layer, forming a gate electrode on the gate insulating film, forming a first electrode on the fourth GaN based semiconductor layer, forming a second electrode at the side of the first GaN based semiconductor layer opposite to the second GaN based semiconductor layer, and forming a third electrode on the second GaN based semiconductor layer.

Figure 8:
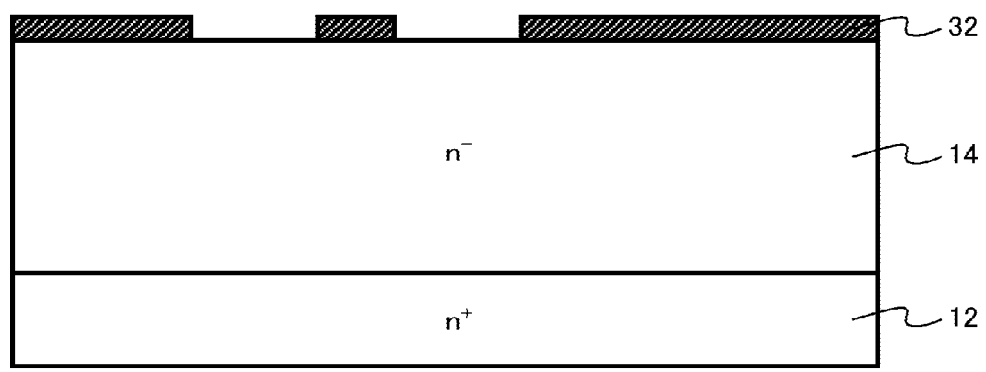
FIG. 8 is a schematic cross-sectional view illustrating the second manufacturing method of the semiconductor device according to the first embodiment.
Figure 9:
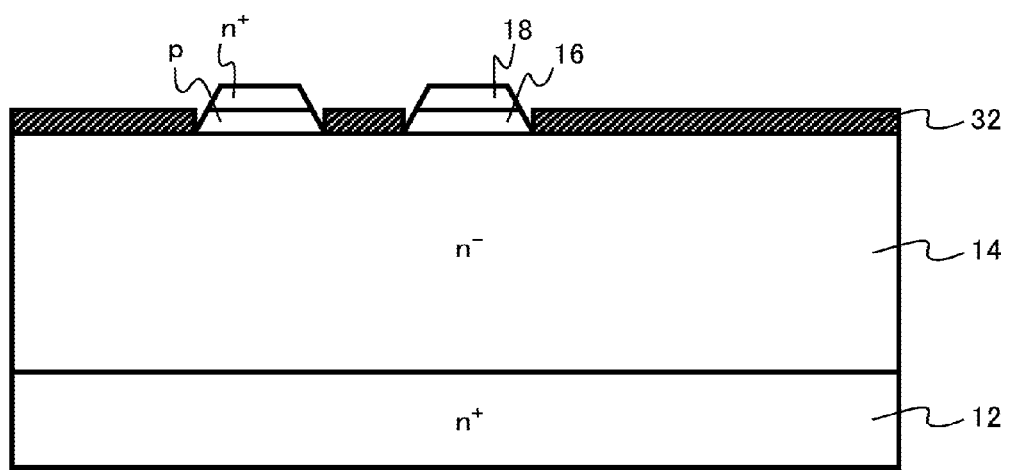
FIG. 9 is a schematic cross-sectional view illustrating the second manufacturing method of the semiconductor device according to the first embodiment.
Figure 10:
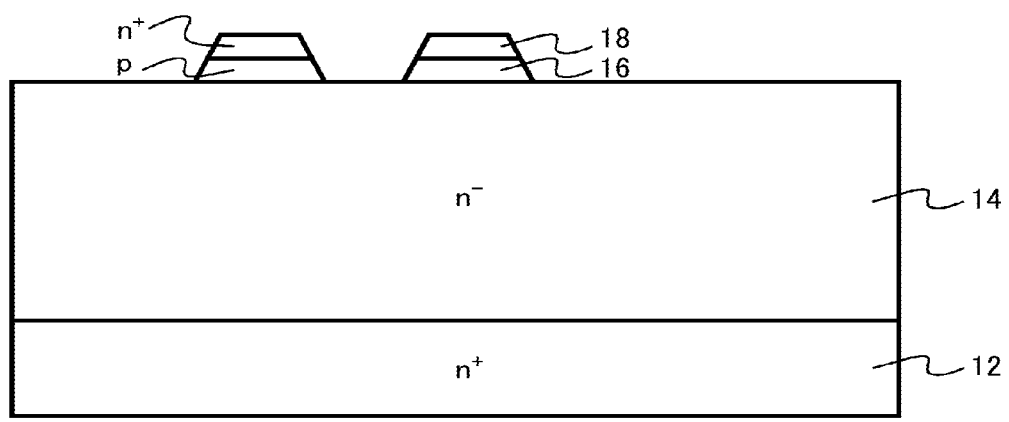
FIG. 10 is a schematic cross-sectional view illustrating the second manufacturing method of the semiconductor device according to the first embodiment.

FIGS. 8 to 10 are schematic cross-sectional views illustrating the second manufacturing method of the semiconductor device according to this embodiment. A description of content overlapped to that of the first manufacturing method will be omitted.

First, similar to the first manufacturing method, the n⁻-type GaN layer (second GaN based semiconductor layer) 14 is formed on the n⁺-type GaN layer 12 by the epitaxial growth method.

Next, the partial region on the n⁻-type GaN layer (second GaN based semiconductor layer) 14 is covered by a mask material 32 (first mask material) (refer to FIG. 8). The mask material 32 is formed by patterning using a known film deposition method, photolithography, and etching. The mask material 32 is, for example, a silicon oxide film.

Next, the p-type GaN layer (third GaN based semiconductor layer) 16 containing the p-type impurities is formed on the n⁻-type GaN layer (second GaN based semiconductor layer) 14 by a selective epitaxial growth method. The p-type impurities are, for example, Mg (magnesium). In addition, source gas is, for example, trimethyl gallium (TMG) or ammonia (NH₃) and a p-type dopant in the source gas is, for example, is cyclopentadienyl magnesium (Cp₂Mg).

Next, the n⁺-type GaN layer (fourth GaN based semiconductor layer) 18 is formed on the p-type GaN layer (third GaN based semiconductor layer) 16 by the selective epitaxial growth method. The n⁺-type GaN layer (fourth GaN based semiconductor layer) 18 contains as the n-type impurities Si (silicon) with the impurity concentration of $1 \times 10^{18}$ cm⁻³ to $1 \times 10^{20}$ cm⁻³.

A mesa structure is formed by the selective epitaxial growth method of the p-type GaN layer 16 and the n⁺-type GaN layer 18 (refer to FIG. 9).

Next, the mask material 32 is peeled (refer to FIG. 10). For example, the mask material 32 is peeled by wet etching.

Then, similar to the first manufacturing method, the gate insulating film 20, the gate electrode 22, the source electrode (first electrode) 24, the drain electrode (second electrode) 26, and the anode electrode (third electrode) 28 are formed.

By the manufacturing method described above, the semiconductor device according to this embodiment illustrated in FIG. 1 is manufactured.

According to this embodiment, the transistor and the diode are formed in one chip, which results in improving an integration degree. Therefore, a semiconductor device in which miniaturization and low consumption power are enabled is realized.

Particularly, in this embodiment, a semiconductor layer formed by ion implantation in an impurity layer is not used. For this reason, an impurity layer having a high activation rate is realized. Therefore, contact resistance of the semiconductor layer and the electrode can be decreased and resistance of the semiconductor layer is also decreased. As a result, a semiconductor device having high performance in which an-on state current is large can be realized.

In addition, according to this embodiment, the transistor and the diode different in the layer structures can be formed in one chip by the simple structure and manufacturing method.

Figure 11:
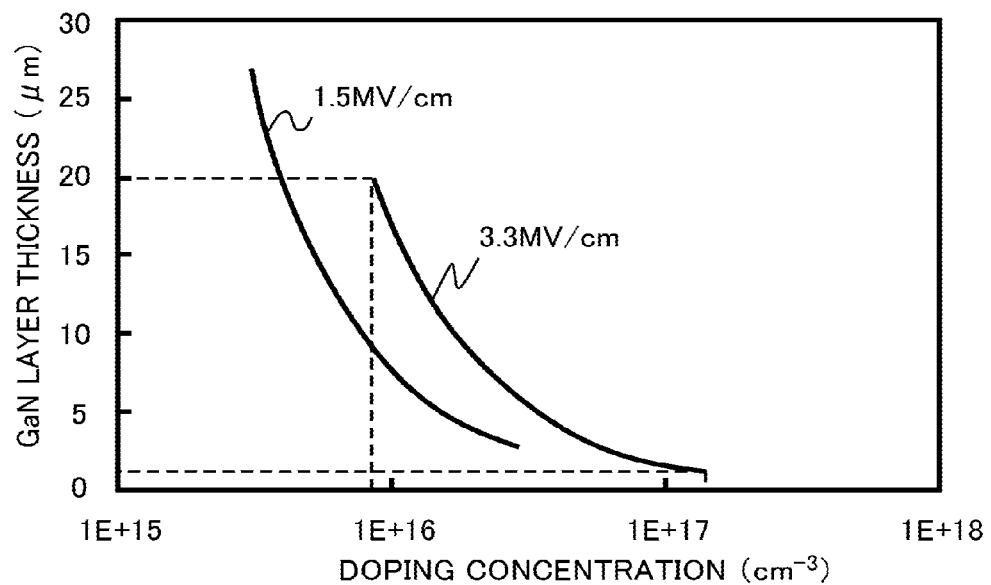
FIG. 11 is a diagram illustrating a relation of an impurity concentration, thickness of a GaN layer, and an electric field.

FIG. 11 is a diagram illustrating a relation of an impurity concentration, thickness of a GaN layer, and an electric field. In FIG. 11, a horizontal axis illustrates an impurity concentration (doping concentration) of a GaN layer and a vertical axis illustrates a thickness of the GaN layer. In FIG. 11, the case in which an electric field to be realized is 1.5 MV/cm and the case in which an electric field to be realized is 3.3 MV/cm are illustrated. When an operation margin of the semiconductor device is considered, the electric field is preferably set to 1.5 MV/cm.

In this embodiment, the breakdown voltage of the semiconductor device is determined under a condition of the n⁻-type GaN layer (second GaN based semiconductor layer) 14. Therefore, the thickness and the n-type impurity concentration of the n⁻-type GaN layer (second GaN based semiconductor layer) 14 are preferably 1 μm to 20 μm and $1 \times 10^{16}$ cm⁻³ to $2 \times 10^{17}$ cm⁻³, respectively, from the viewpoint of realizing the electric field of 1.5 MV/cm.

Second Embodiment

A semiconductor device according to this embodiment is different from the semiconductor device according to the first embodiment in that the semiconductor device further includes a plurality of fifth GaN based semiconductor layers of a second conductive type, which surround a first electrode or a third electrode, are provided to be separated from each other, and have substantially the same impurity concentration of a second conductive type as a third GaN based semiconductor layer, provided in a partial region on or above a second GaN based semiconductor layer. In addition, the semiconductor device according to this embodiment is different from the semiconductor device according to the first embodiment in that the semiconductor device further includes a sixth GaN based semiconductor layer of the second conductive type, which contacts the third electrode and has substantially the same impurity concentration of the second conductive type as the third GaN based semiconductor layer and the fifth GaN based semiconductor layer, provided in a partial region on or above the second GaN based semiconductor layer. Hereinafter, a part of a description of content overlapped to the content of the first embodiment will be omitted.

Figure 12:
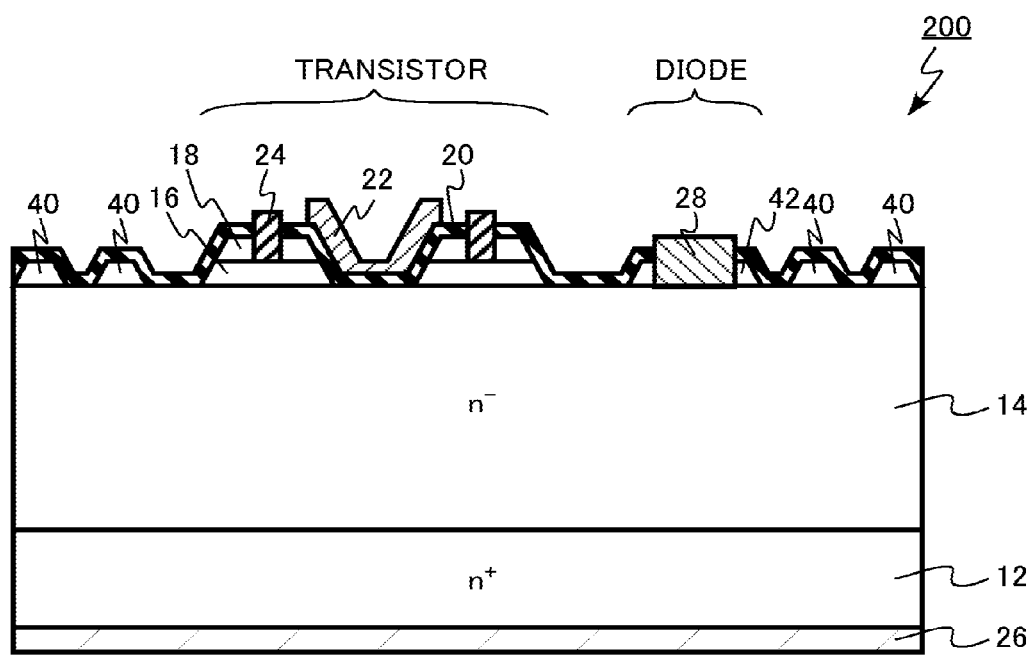
FIG. 12 is a schematic cross-sectional view illustrating a configuration of a semiconductor device according to a second embodiment.

FIG. 12 is a schematic cross-sectional view illustrating a configuration of the semiconductor device according to this embodiment. A semiconductor device 200 according to this embodiment includes p-type termination structures (fifth GaN based semiconductor layers) 40 and a p-type termination portion (sixth GaN based semiconductor layer) 42, in addition to the structure according to the first embodiment.

The plurality of p-type termination structures (fifth GaN based semiconductor layers) 40 are provided in a partial region on an n⁻-type GaN layer (second GaN based semiconductor layer) 14 to surround a source electrode (first electrode) 24 or an anode electrode (third electrode) 28. The p-type termination structures 40 are separated from each other.

The p-type termination structures 40 are so-called guard rings. By providing the p-type termination structures 40, an electric field applied to a drain side of a transistor or a cathode side of a diode is alleviated and a breakdown voltage of the transistor or the diode is improved.

The p-type termination portion (sixth GaN based semiconductor layer) 42 is provided in a partial region on the n⁻-type GaN layer (second GaN based semiconductor layer) 14 to contact the anode electrode (third electrode) 28. By providing the termination portion 42, an electric field of the anode electrode (third electrode) 28 is alleviated and the breakdown voltage of the diode is improved.

The p-type termination structures (fifth GaN based semiconductor layers) 40 and the p-type termination portion (sixth GaN based semiconductor layer) 42 are formed in substantially the same semiconductor layer as a p-type GaN layer (third GaN based semiconductor layer) 16. Therefore, the p-type termination structures (fifth GaN based semiconductor layers) 40 and the p-type termination portion (sixth GaN based semiconductor layer) 42 have substantially the same p-type impurity concentration as the p-type GaN layer (third GaN based semiconductor layer) 16.

Next, a first manufacturing method of the semiconductor device according to this embodiment will be described.

The first manufacturing method of the semiconductor device according to this embodiment is different from the first manufacturing method of the semiconductor device according to the first embodiment in that partial regions of the fourth GaN based semiconductor layer and the third GaN based semiconductor layer are etched to form a plurality of second convex portions of the third GaN based semiconductor layer to be separated from each other and the partial region of the third GaN based semiconductor layer of the second convex portions is etched to exposure the second GaN based semiconductor layer and the third electrode is formed. Hereinafter, a part of a description of content overlapped to the content of the first manufacturing method of the semiconductor device according to the first embodiment will be omitted.

FIGS. 13 to 18 are schematic cross-sectional views illustrating the first manufacturing method of the semiconductor device according to this embodiment.

Formation of an n⁺-type GaN layer (first GaN based semiconductor layer) 12, an n⁻-type GaN layer (second GaN based semiconductor layer) 14, a p-type GaN layer (third GaN based semiconductor layer) 16, and an n⁺-type GaN layer (fourth GaN based semiconductor layer) 18 is the same as that of the first embodiment.

Figure 13:
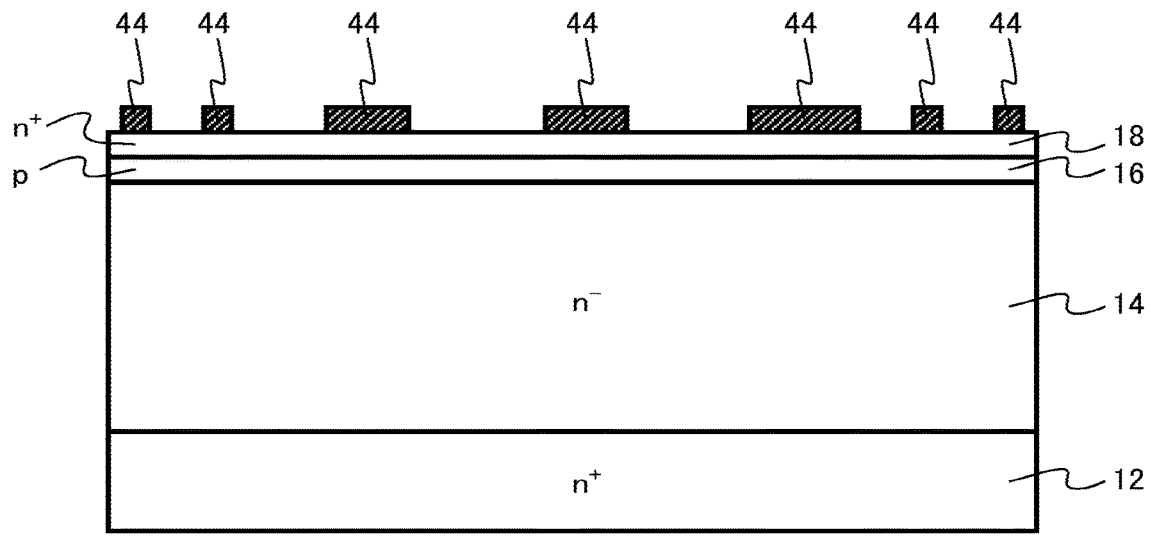
FIG. 13 is a schematic cross-sectional view illustrating a first manufacturing method of the semiconductor device according to the second embodiment.

Next, a mask material 44 is formed on the n⁺-type GaN layer (fourth GaN based semiconductor layer) 18 (refer to FIG. 13). For example, the mask material 44 is formed by a known lithographic technique. The mask material 44 is a resist.

Figure 14:
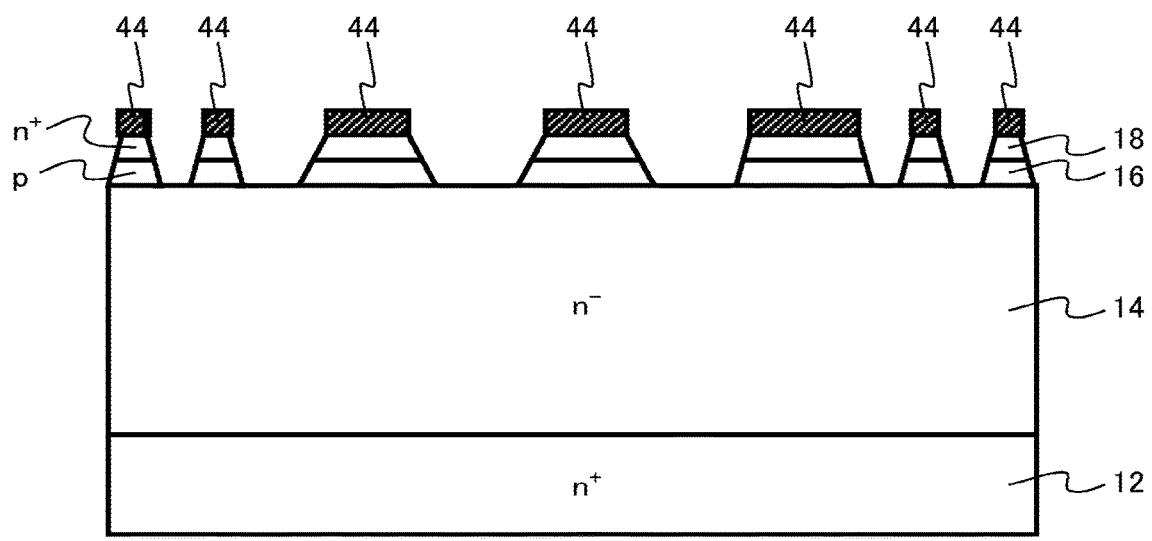
FIG. 14 is a schematic cross-sectional view illustrating the first manufacturing method of the semiconductor device according to the second embodiment.
Figure 15:
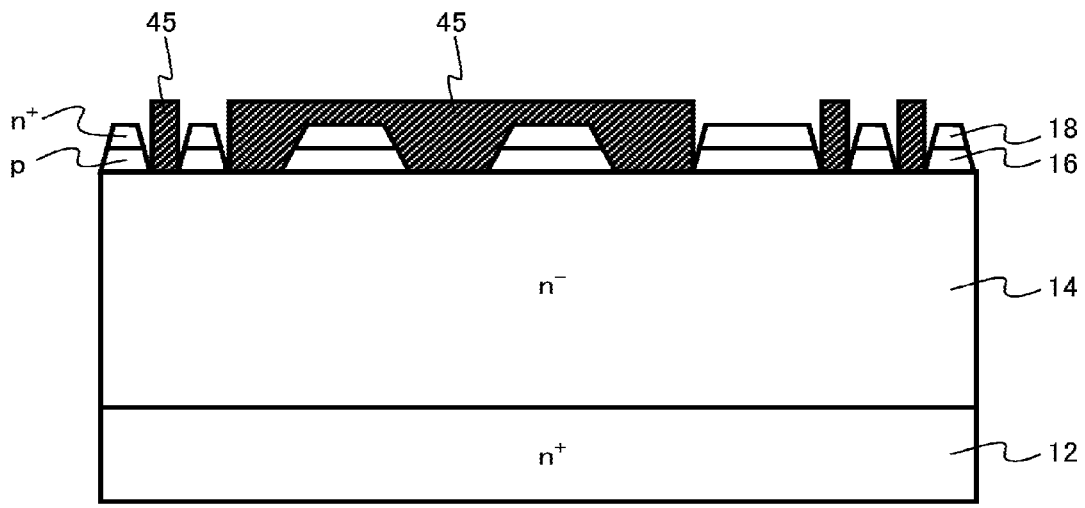
FIG. 15 is a schematic cross-sectional view illustrating the first manufacturing method of the semiconductor device according to the second embodiment.

Next, the n⁺-type GaN layer (fourth GaN based semiconductor layer) 18 and the p-type GaN layer (third GaN based semiconductor layer) 16 are etched using the mask material 44 as a mask (refer to FIG. 14). For example, the etching is performed by reactive ion etching (RIE).

Next, the mask material 44 is peeled. Then, the mask material 45 is formed such that the partial region of the n⁺-type GaN layer (fourth GaN based semiconductor layer) 18 is exposed (refer to FIG. 15). For example, the mask material 45 is formed by the known photolithographic technique. The mask material 45 is a resist.

Figure 16:
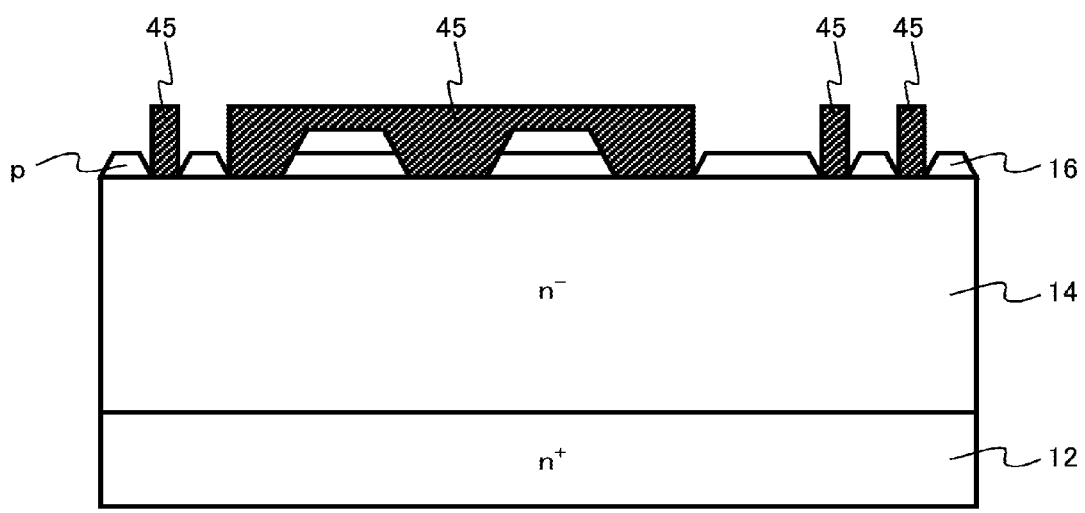
FIG. 16 is a schematic cross-sectional view illustrating the first manufacturing method of the semiconductor device according to the second embodiment.

Next, the partial region of the n⁺-type GaN layer (fourth GaN based semiconductor layer) 18 is etched using the mask material 45 as a mask (refer to FIG. 16). For example, the etching is performed by reactive ion etching (RIE).

Figure 17:
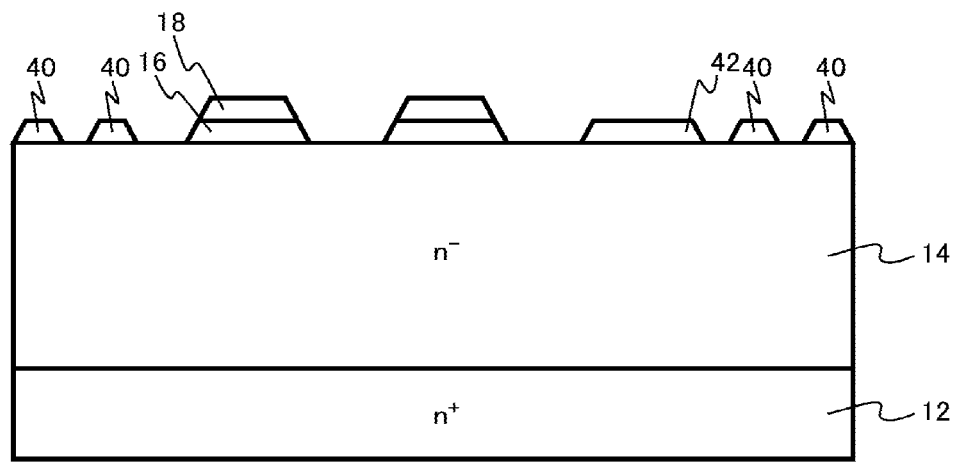
FIG. 17 is a schematic cross-sectional view illustrating the first manufacturing method of the semiconductor device according to the second embodiment.

Next, the mask material 45 is peeled (refer to FIG. 17).

By the above process, a mesa structure of the transistor, the p-type termination structure (fifth GaN based semiconductor layer) 40 of the transistor or the diode, and the p-type termination portion (sixth GaN based semiconductor layer) 42 of the diode are formed. The mesa structure of the transistor corresponds to the first convex portion and the p-type termination structure 40 of the diode and the p-type termination portion (sixth GaN based semiconductor layer) 42 of the diode correspond to the second convex portion.

Figure 18:
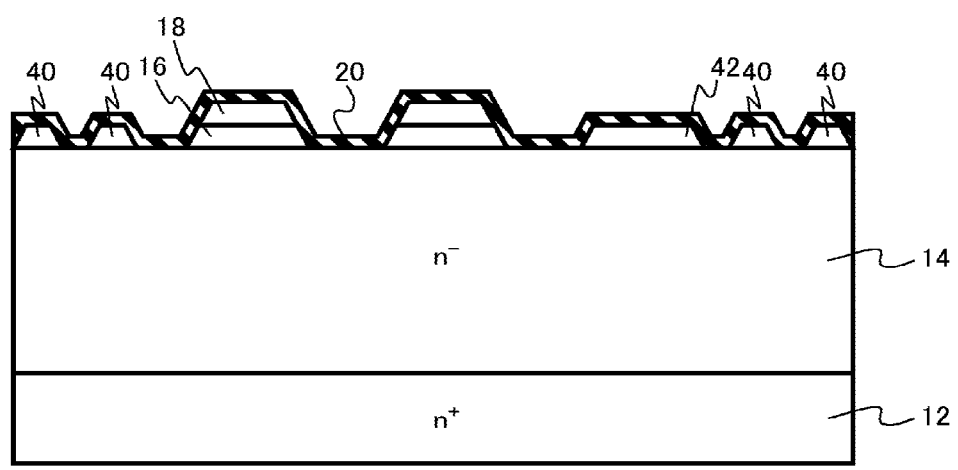
FIG. 18 is a schematic cross-sectional view illustrating the first manufacturing method of the semiconductor device according to the second embodiment.

The gate insulating film 20 is formed on the n⁻-type GaN layer (second GaN based semiconductor layer) 14, the p-type GaN layer (third GaN based semiconductor layer) 16, the n⁺-type GaN layer (fourth GaN based semiconductor layer) 18, the p-type termination structure (fifth GaN based semiconductor layer) 40, and the p-type termination portion (sixth GaN based semiconductor layer) 42 (refer to FIG. 18). For example, the gate insulating film 20 is formed by depositing a silicon nitride film by a low pressure chemical vapor deposition (LPCVD) method and a plasma enhanced chemical vapor deposition (PECVD) method.

Next, the gate electrode 22 is formed on the gate insulating film 20. In the formation of the gate electrode 22, a resist mask is formed on the gate insulating film 20 using a photolithographic technique. Then, the gate electrode 22 is formed in only a patterned place using a deposition method and a lift-off method.

Then, the source electrode (first electrode) 24, the drain electrode (second electrode) 26, and the anode electrode (third electrode) 28 are formed using a known process.

The anode electrode (third electrode) 28 is formed by etching the partial region of the p-type GaN layer (third GaN based semiconductor layer) 16 of the p-type termination portion (sixth GaN based semiconductor layer) 42 to expose the n⁻-type GaN layer (second GaN based semiconductor layer) 14.

By the manufacturing method described above, the semiconductor device according to this embodiment illustrated in FIG. 12 is manufactured.

Next, a second manufacturing method of the semiconductor device according to this embodiment will be described.

The second manufacturing method of the semiconductor device according to this embodiment is different from the second manufacturing method of the semiconductor device according to the first embodiment in that the partial region on the third GaN based semiconductor layer is covered by the second mask material, when the fourth GaN based semiconductor layer is formed. Hereinafter, a part of a description of content overlapped to the content of the second manufacturing method of the semiconductor device according to the first embodiment will be omitted.

FIGS. 19 to 23 are schematic cross-sectional views illustrating the second manufacturing method of the semiconductor device according to this embodiment. A description of content overlapped to that of the first manufacturing method will be omitted.

First, similar to the first manufacturing method, the n⁻-type GaN layer (second GaN based semiconductor layer) 14 is formed on the n⁺-type GaN layer (first GaN based semiconductor layer) 12 by the epitaxial growth method.

Figure 19:
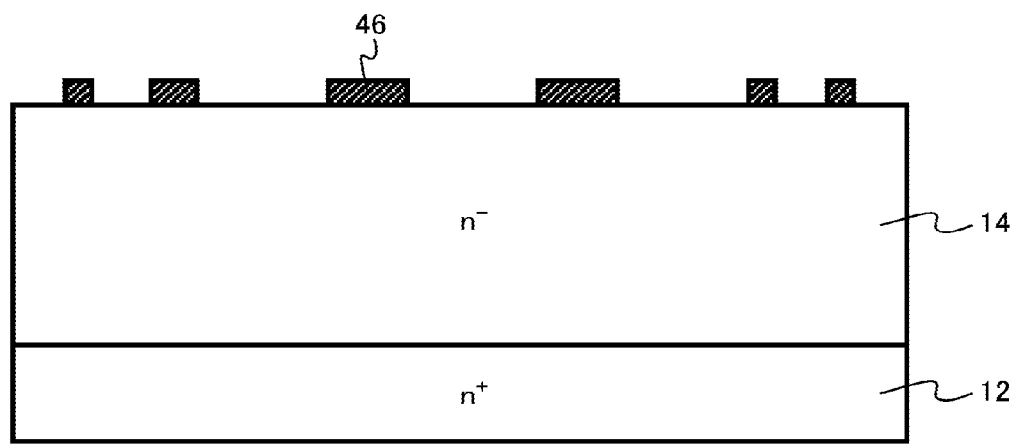
FIG. 19 is a schematic cross-sectional view illustrating a second manufacturing method of the semiconductor device according to the second embodiment.

Next, the partial region on the n⁻-type GaN layer (second GaN based semiconductor layer) 14 is covered by a mask material (first mask material) 46 (refer to FIG. 19). The mask material 46 is formed by patterning using a known film deposition method, photolithography, and etching. The mask material 46 is, for example, a silicon oxide film.

Figure 20:
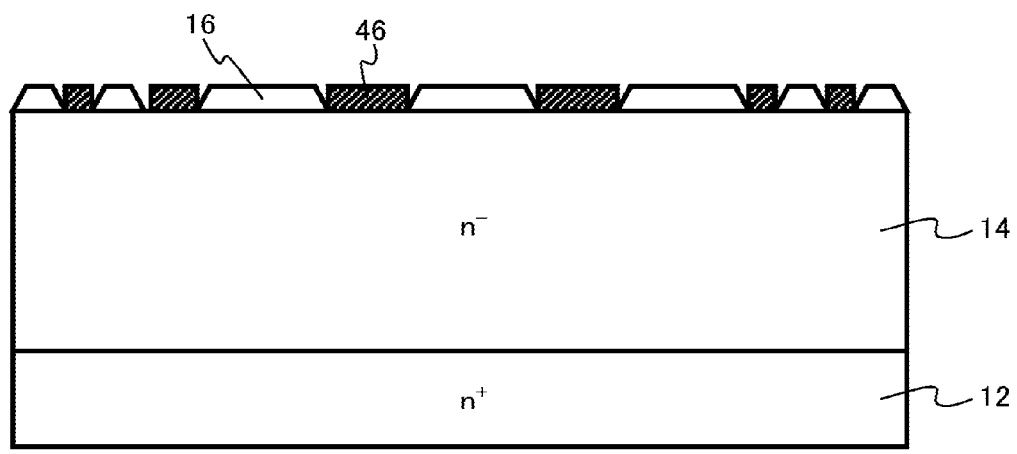
FIG. 20 is a schematic cross-sectional view illustrating the second manufacturing method of the semiconductor device according to the second embodiment.

Next, the p-type GaN layer (third GaN based semiconductor layer) 16 containing the p-type impurities is formed on the n⁻-type GaN layer (second GaN based semiconductor layer) 14 by the selective epitaxial growth method (refer to FIG. 20). The p-type impurities are, for example, Mg (magnesium). In addition, source gas is, for example, trimethyl gallium (TMG) or ammonia (NH₃) and a p-type dopant in the source gas is, for example, is cyclopentadienyl magnesium (Cp-Mg).

Figure 21:
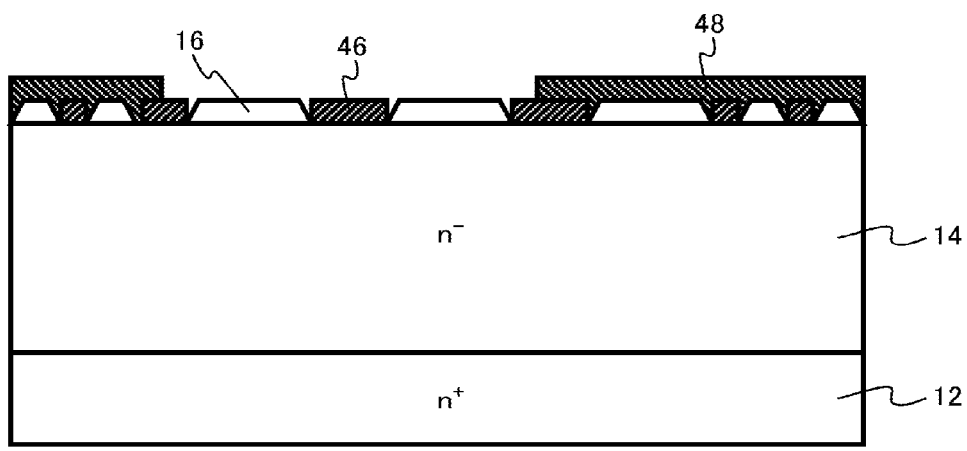
FIG. 21 is a schematic cross-sectional view illustrating the second manufacturing method of the semiconductor device according to the second embodiment.

Next, the partial region on the p-type GaN layer (third GaN based semiconductor layer) 16 is covered by a mask material (second mask material) 48 (refer to FIG. 21). The mask material 48 is formed by patterning using a known film deposition method, photolithography, and etching. The mask material 46 is, for example, a silicon oxide film.

Figure 22:
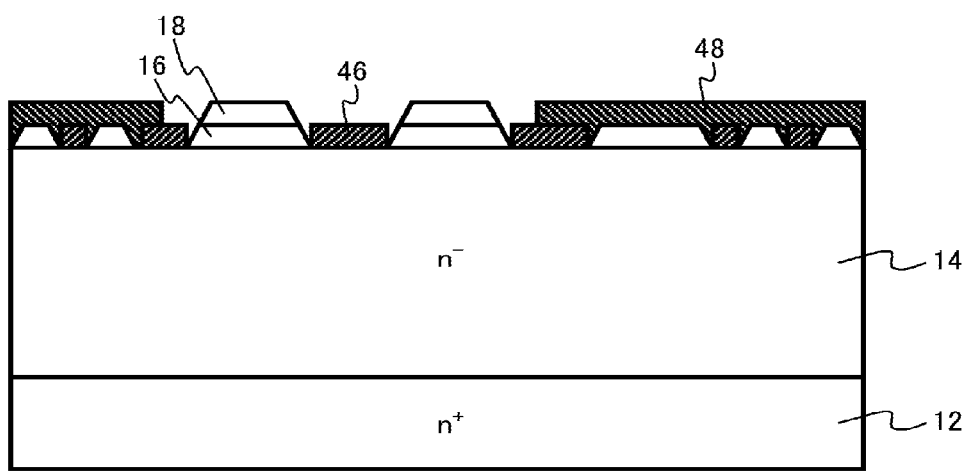
FIG. 22 is a schematic cross-sectional view illustrating the second manufacturing method of the semiconductor device according to the second embodiment.

Next, the n⁺-type GaN layer (fourth GaN based semiconductor layer) 18 is formed on the p-type GaN layer (third GaN based semiconductor layer) 16 by the selective epitaxial growth method (refer to FIG. 22). The n⁺-type GaN layer (fourth GaN based semiconductor layer) 18 contains as the n-type impurities Si (silicon) with the impurity concentration of $1 \times 10^{13}$ cm⁻¹ to $1 \times 10^{20}$ cm⁻³.

Figure 23:
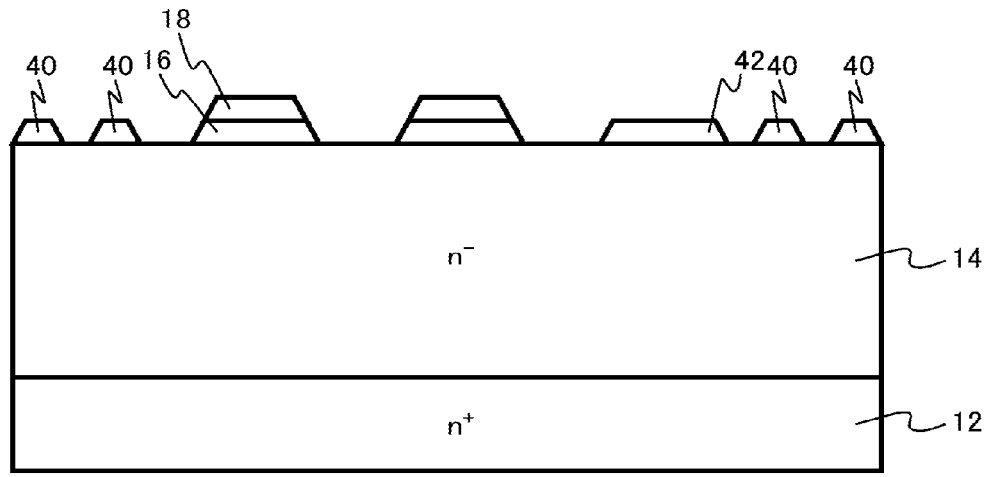
FIG. 23 is a schematic cross-sectional view illustrating the second manufacturing method of the semiconductor device according to the second embodiment.

Next, the mask materials 46 and 48 are peeled (refer to FIG. 23). For example, the mask materials 46 and 48 are peeled by wet etching.

Then, similar to the first manufacturing method, the gate insulating film 20, the gate electrode 22, the source electrode (first electrode) 24, the drain electrode (second electrode) 26, and the anode electrode (third electrode) 28 are formed.

By the manufacturing method described above, the semiconductor device according to this embodiment illustrated in FIG. 12 is manufactured.

According to this embodiment, in addition to the effect of the first embodiment, the breakdown voltages of the transistor and the diode are improved. Therefore, a semiconductor device having a higher breakdown voltage is realized.

The p-type impurity concentrations of the p-type GaN layer (third GaN based semiconductor layer) 16, the p-type termination structure (fifth GaN based semiconductor layer) 40, and the p-type termination portion (sixth GaN based semiconductor layer) 42 are preferably higher than the n-type impurity concentration of the n⁻-type GaN layer (second GaN based semiconductor layer) 14 by one digit or more and three digit or less, from the viewpoint of improving the breakdown voltage of the semiconductor device 200.

Third Embodiment

A semiconductor device according to this embodiment is the same as the semiconductor device according to the second embodiment, except that the semiconductor device includes a Si (silicon) substrate of a first conductive type provided between a first GaN based semiconductor layer of the first conductive type and a second electrode. Therefore, a description of the same content as that of the second embodiment will be omitted.

Figure 24:
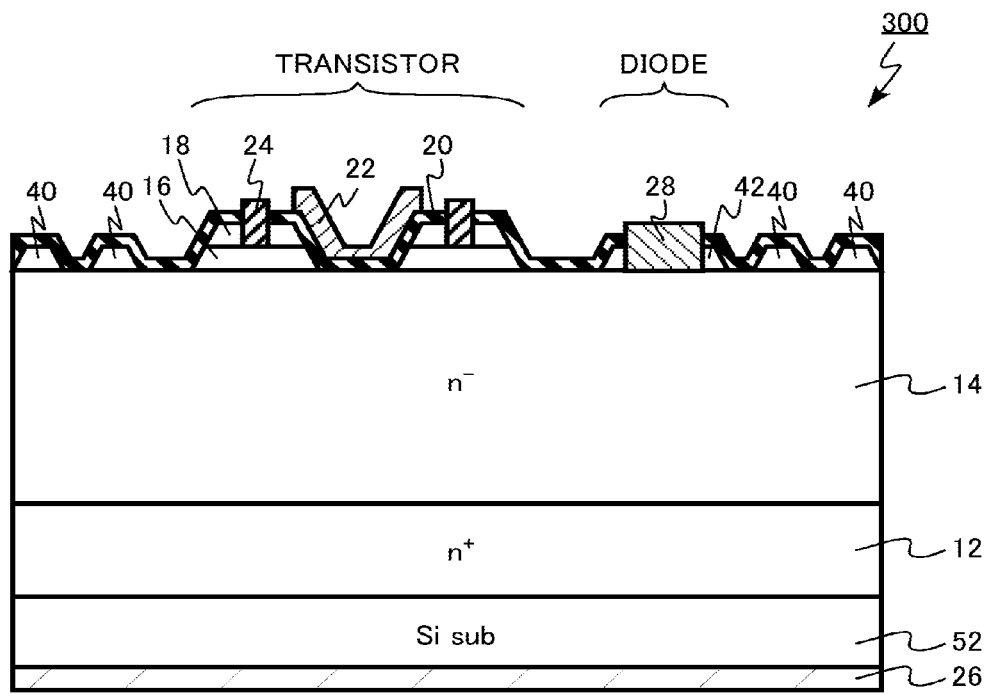
FIG. 24 is a schematic cross-sectional view illustrating a configuration of a semiconductor device according to a third embodiment.

FIG. 24 is a schematic cross-sectional view illustrating a configuration of the semiconductor device according to this embodiment. A semiconductor device 300 according to this embodiment includes an n-type Si (silicon) substrate 52 provided between an n⁺-type GaN layer (first GaN based semiconductor layer) 12 and a drain electrode (second electrode) 26, in addition to the structure according to the first embodiment.

In the semiconductor device according to this embodiment, a GaN based semiconductor layer is formed on the n-type Si (silicon) substrate 52 by a heteroepitaxial growth. The n⁺-type GaN layer (first GaN based semiconductor layer) 12 functions as a buffer layer.

The same effect as the second embodiment is obtained by this embodiment. In this embodiment, the n-type Si (silicon) substrate 52 can be used as the substrate of the epitaxial growth, a cost of the semiconductor device 400 can be decreased, and a diameter of a wafer can be easily increased.

Fourth Embodiment

A semiconductor device according to this embodiment is the same as the semiconductor device according to the third embodiment, except that a concave portion reaching an n⁺-type GaN layer (first GaN based semiconductor layer) is provided in an n-type Si (silicon) substrate. Therefore, a description of the same content as that of the third embodiment will be omitted.

Figure 25:
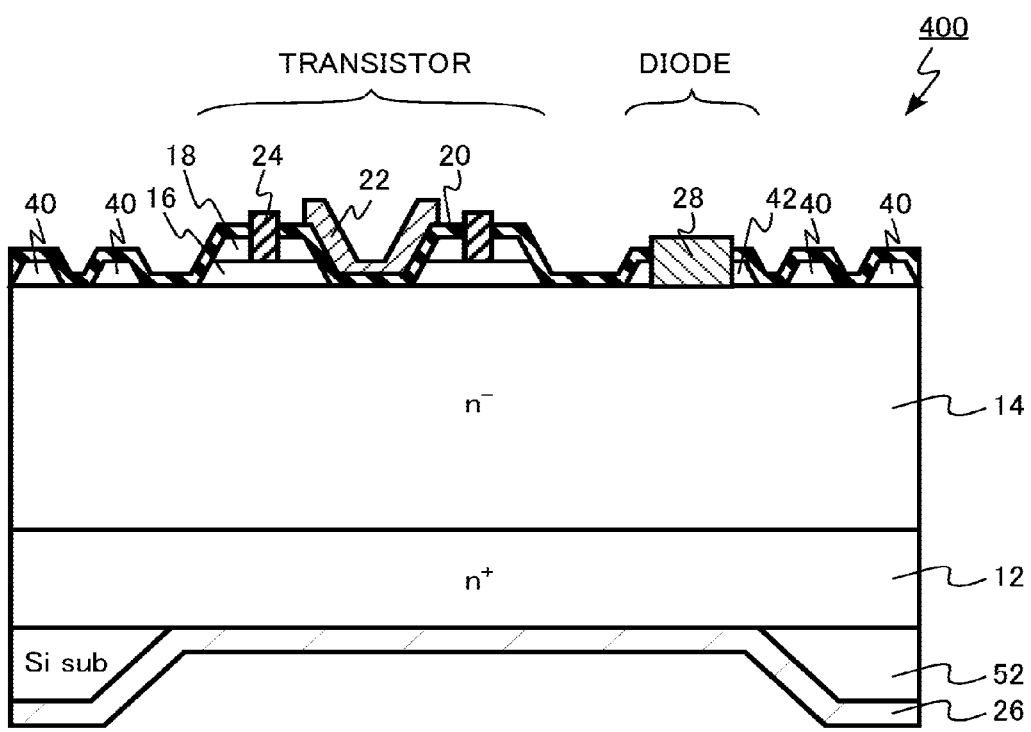
FIG. 25 is a schematic cross-sectional view illustrating a configuration of a semiconductor device according to a fourth embodiment.

FIG. 25 is a schematic cross-sectional view illustrating a configuration of the semiconductor device according to this embodiment. In a semiconductor device 400 according to this embodiment, in addition to the structure according to the third embodiment, a concave portion reaching an n⁺-type GaN layer (first GaN based semiconductor layer) 12 is provided in an n-type Si (silicon) substrate 52. In addition, a drain electrode 26 is provided in the concave portion. The concave portion is provided by etching.

The same effect as the third embodiment is obtained by this embodiment. In addition, the concave portion is provided in the n-type Si (silicon) substrate 52 and the drain electrode 26 is formed in the concave portion, which results in decreasing on-resistance.

The entire n-type Si (silicon) substrate 52 can be removed by etching or polishing. In this case, an element structure is the same as that of the second embodiment.

In the embodiments, the example of the case in which the first conductive type is the n type and the second conductive type is the p type has been described. However, the first conductive type may be the p type and the second conductive type may be the n type.

In the embodiments, the example of the case in which one transistor and one diode are formed in one chip has been described. However, one transistor and a plurality of diodes, a plurality of transistors and one diode, or a plurality of transistors and a plurality of diodes can be formed in one chip.

While certain embodiments have been described, these embodiments have been presented by way of example only, and are not intended to limit the scope of the inventions. Indeed, the semiconductor device and the method of manufacturing the same described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device comprising:
   a first GaN based semiconductor layer of a first conductive type;
   a second GaN based semiconductor layer of the first conductive type provided above the first GaN based semiconductor layer, the second GaN based semiconductor layer having an impurity concentration of the first conductive type lower than that of the first GaN based semiconductor layer;
   a third GaN based semiconductor layer of a second conductive type provided above a part of the second GaN based semiconductor layer;
   a fourth GaN based semiconductor layer of the first conductive type provided above the third GaN based semiconductor layer, the fourth GaN based semiconductor layer having the impurity concentration of the first conductive type higher than that of the second GaN based semiconductor layer;
   a gate insulating film provided on the second GaN based semiconductor layer, the third GaN based semiconductor layer, and the fourth GaN based semiconductor layer;
   a gate electrode provided on the gate insulating film;
   a first electrode provided on the fourth GaN based semiconductor layer;
   a second electrode provided at a side of the first GaN based semiconductor layer opposite to the second GaN based semiconductor layer;
   a third electrode provided on the second GaN based semiconductor layer; and
   a plurality of fifth GaN based semiconductor layers of the second conductive type provided above a part of the second GaN based semiconductor layer, the plurality of fifth GaN based semiconductor layers surrounding the first electrode and the third electrode, the plurality of fifth GaN based semiconductor layers being provided to be separated from each other, the plurality of fifth GaN based semiconductor layers having substantially the same impurity concentration of the second conductive type as the third GaN based semiconductor layer;
   wherein the first electrode is provided in a groove having a bottom-face and side-faces, the third GaN based semiconductor layer is exposed to the bottom-face, the fourth GaN based semiconductor layer is exposed to the side-faces, and the first electrode is in contact with the third GaN based semiconductor layer.

2. The device according to claim 1, further comprising:
   a sixth GaN based semiconductor layer of the second conductive type provided above a part of the second GaN based semiconductor layer, the sixth GaN based semiconductor layer being in contact with the third electrode, the sixth GaN based semiconductor layer having substantially the same impurity concentration of the second conductive type as the third GaN based semiconductor layer.

3. The device according to claim 2, wherein the impurity concentrations of the second conductive type of the third GaN based semiconductor layer, the fifth GaN based semiconductor layer, and the sixth GaN based semiconductor layer are higher than the impurity concentration of the first conductive type of the second GaN based semiconductor layer by one digit or more.

4. The device according to claim 1, wherein the thickness of the second GaN based semiconductor layer is 1 μm to 20 μm and the impurity concentration of the first conductive type of the second GaN based semiconductor layer is $1 \times 10^{16}$ cm$^{-3}$ to $2 \times 10^{17}$ cm$^{-3}$.

5. The device according to claim 1, wherein the thickness of the third GaN based semiconductor layer is 0.1 μm to 2 μm.

6. The device according to claim 1, wherein the first electrode and the third electrode are made of different materials.

7. The device according to claim 1, wherein the second GaN based semiconductor layer is in Schottky contact with the third electrode.

8. The device according to claim 1, wherein the fourth GaN based semiconductor layer is in ohmic contact with the first electrode and the first GaN based semiconductor layer is in ohmic contact with the second electrode.

9. The device according to claim 1, wherein the gate insulating film provided directly on the second GaN based semiconductor layer.

* * * * *